United States Patent
Muraki et al.

(10) Patent No.: US 10,910,236 B2
(45) Date of Patent: Feb. 2, 2021

(54) SEMICONDUCTOR MANUFACTURING APPARATUS AND METHOD OF MANUFACTURING SEMICONDUCTOR DEVICE

(71) Applicant: TOSHIBA MEMORY CORPORATION, Minato-ku (JP)

(72) Inventors: Shinsuke Muraki, Kuwana (JP); Hiroaki Yamada, Yokkaichi (JP); Yuji Hashimoto, Kuwana (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 53 days.

(21) Appl. No.: 16/294,978

(22) Filed: Mar. 7, 2019

(65) Prior Publication Data

US 2020/0090960 A1  Mar. 19, 2020

(30) Foreign Application Priority Data

Sep. 13, 2018 (JP) .................. 2018-171342

(51) Int. Cl.
*H01L 21/67* (2006.01)
*H01L 21/306* (2006.01)

(52) U.S. Cl.
CPC .. *H01L 21/67075* (2013.01); *H01L 21/30604* (2013.01); *H01L 21/67248* (2013.01); *H01L 21/67253* (2013.01)

(58) Field of Classification Search
CPC ......... H01L 21/67075; H01L 21/30604; H01L 21/67248
See application file for complete search history.

(56) References Cited

U.S. PATENT DOCUMENTS

| 7,122,084 B2 | 10/2006 | Hohenwarter |
| 2003/0180471 A1* | 9/2003 | Takekuma ........ H01L 21/67253 430/271.1 |
| 2012/0260946 A1* | 10/2012 | Ogata ...................... B08B 3/10 134/18 |
| 2015/0093906 A1 | 4/2015 | Kobayashi et al. |

(Continued)

FOREIGN PATENT DOCUMENTS

| JP | 2005-530605 | 10/2005 |
| JP | 2017-216478 | 12/2017 |
| JP | 2018-6623 | 1/2018 |

*Primary Examiner* — Errol V Fernandes
(74) *Attorney, Agent, or Firm* — Oblon, McClelland, Maier & Neustadt, L.L.P.

(57) ABSTRACT

In one embodiment, a semiconductor manufacturing apparatus includes a liquid supplier configured to supply liquid to a film on a substrate and cause a substance to dissolve from the film in the liquid. The apparatus further includes a first channel configured to recover the liquid supplied to the film and feed the liquid again to the liquid supplier, and a second channel configured to drain the liquid supplied to the film. The apparatus further includes a first switching module configured to switch a discharge destination of the liquid supplied to the film between the first and second channels, and a second switching module configured to switch between supplementing and not supplementing the first channel with new liquid. The apparatus further includes a controller configured to control the first and second switching modules to adjust concentration of the substance in the liquid to be supplied to the film.

6 Claims, 5 Drawing Sheets

(56) References Cited

U.S. PATENT DOCUMENTS

| | | | |
|---|---|---|---|
| 2017/0338131 A1* | 11/2017 | Amahisa | B08B 3/08 |
| 2018/0012777 A1 | 1/2018 | Sato | |
| 2018/0197756 A1* | 7/2018 | Hashizume | H01L 21/02052 |
| 2018/0226277 A1* | 8/2018 | Wakiyama | H01L 21/6708 |
| 2018/0277398 A1* | 9/2018 | Osada | H01L 21/67248 |
| 2018/0277399 A1* | 9/2018 | Hashimoto | H01L 21/67017 |
| 2019/0011734 A1* | 1/2019 | Otsuji | H01L 21/30604 |

* cited by examiner

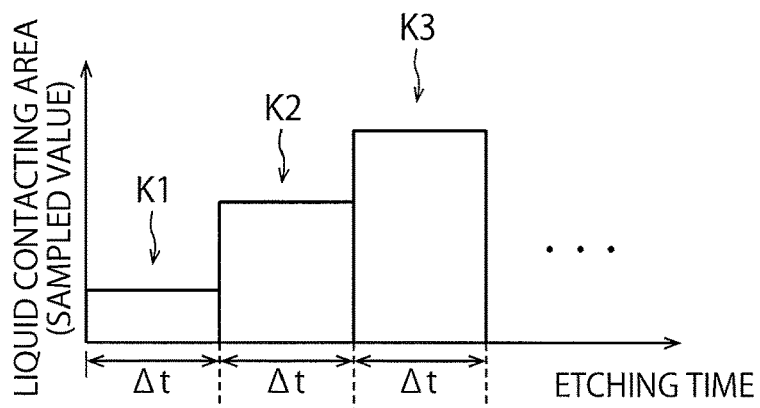
FIG. 4A
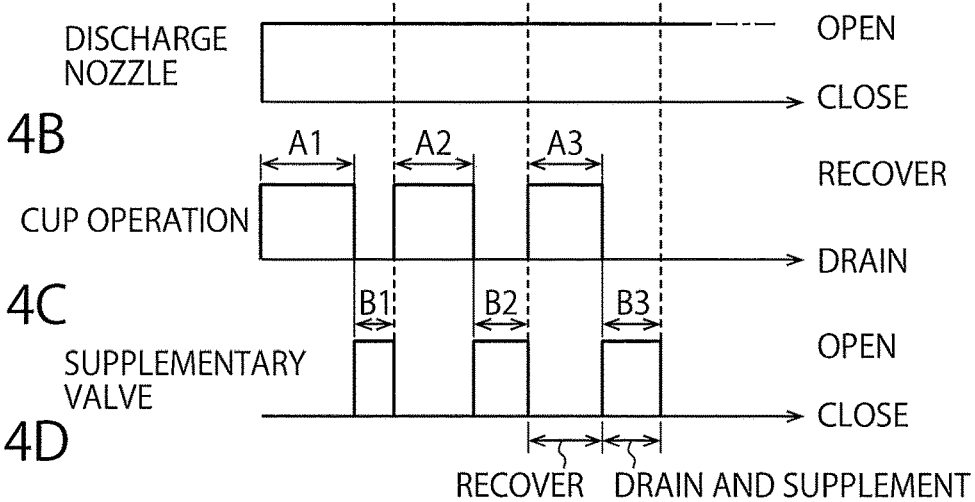
FIG. 4B
FIG. 4C
FIG. 4D
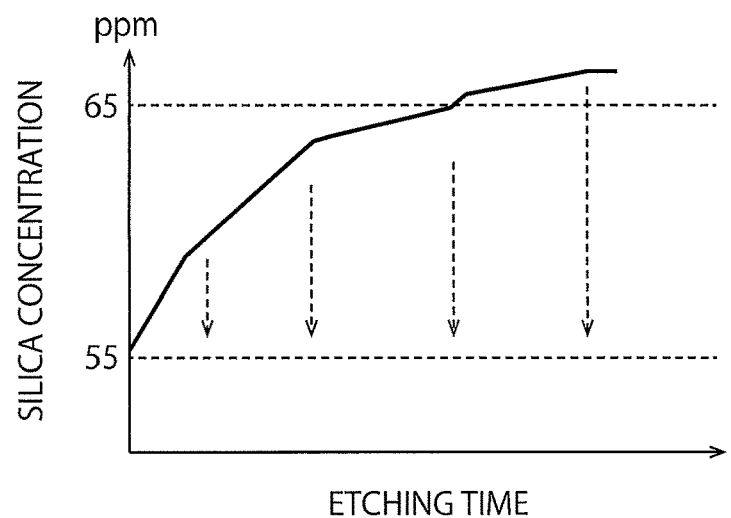
FIG. 5

SEMICONDUCTOR MANUFACTURING APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2018-171342, filed on Sep. 13, 2018, the entire contents of which are incorporated herein by reference.

FIELD

Embodiments described herein relate to a semiconductor manufacturing apparatus and a method of manufacturing a semiconductor device.

BACKGROUND

When a silicon nitride film on a substrate is treated with a phosphoric acid aqueous solution that is circulated in a chamber containing the substrate, silica dissolves from the silicon nitride film in the phosphoric acid aqueous solution. In this case, precipitation of silica needs to be prevented. However, it is undesirable to frequently replace the phosphoric acid aqueous solution to prevent the precipitation of the silica. The same applies to the cases of treating films other than the silicon nitride film and the cases of using liquids other than the phosphoric acid aqueous solution.

BRIEF DESCRIPTION OF THE DRAWINGS

FIGS. 4A to 4D are other graphs for explaining the operations of the semiconductor manufacturing apparatus of the first embodiment;

FIG. 5 is another graph for explaining the operations of the semiconductor manufacturing apparatus of the first embodiment.

DETAILED DESCRIPTION

In one embodiment, a semiconductor manufacturing apparatus includes a liquid supplier configured to supply liquid to a film on a substrate and cause a substance to dissolve from the film in the liquid. The apparatus further includes a first channel configured to recover the liquid supplied to the film and feed the liquid again to the liquid supplier, and a second channel configured to drain the liquid supplied to the film. The apparatus further includes a first switching module configured to switch a discharge destination of the liquid supplied to the film between the first channel and the second channel, and a second switching module configured to switch between supplementing and not supplementing the first channel with new liquid. The apparatus further includes a controller configured to control the first and second switching modules to adjust concentration of the substance in the liquid to be supplied to the film.

Embodiments will now be explained with reference to the accompanying drawings.

First Embodiment

Figure 1:
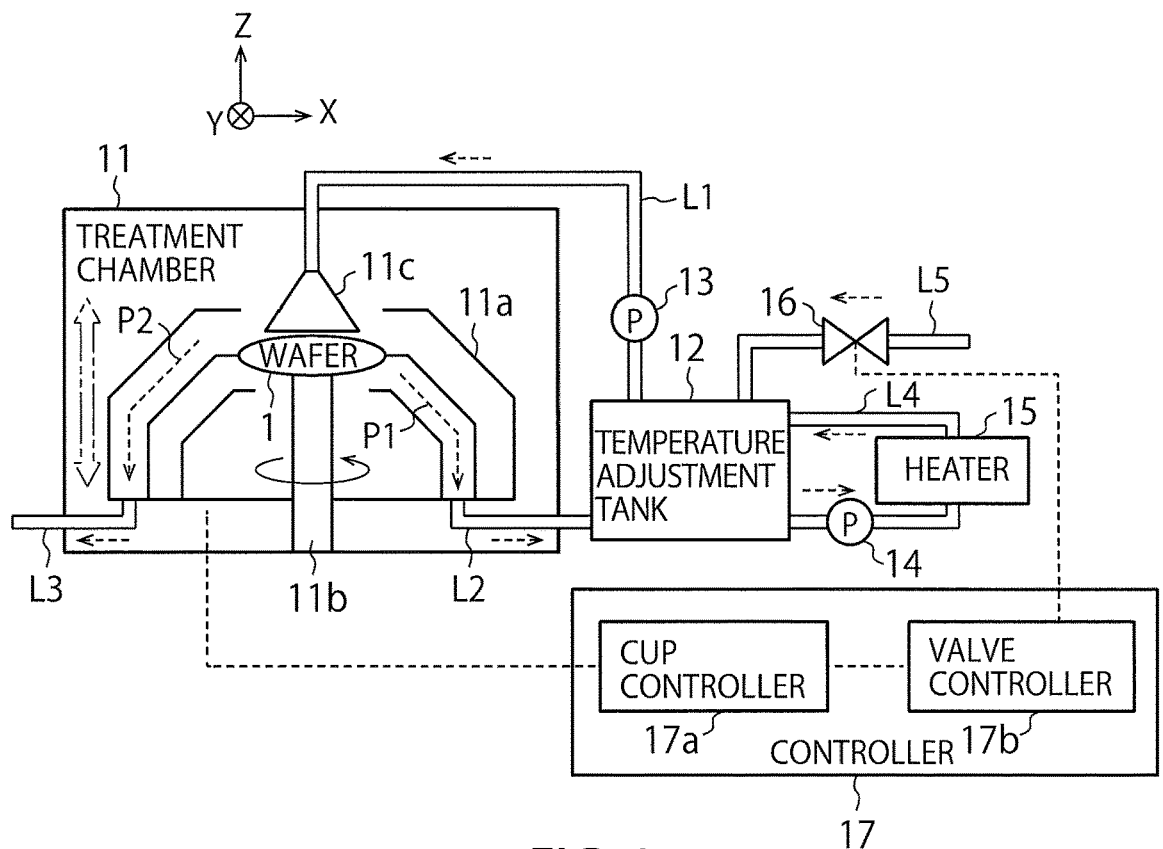
FIG. 1 is a schematic diagram illustrating a configuration of a semiconductor manufacturing apparatus of a first embodiment.

FIG. 1 is a schematic diagram illustrating a configuration of a semiconductor manufacturing apparatus of a first embodiment. The semiconductor manufacturing apparatus of FIG. 1 is a single wafer etching apparatus that treats a wafer 1 by an etching solution.

The semiconductor manufacturing apparatus of FIG. 1 includes a treatment chamber 11 including a recovery cup 11a, a rotary shaft 11b, and a nozzle 11c. The semiconductor manufacturing apparatus further includes a temperature adjustment tank 12, a first pump 13, a second pump 14, a heater 15, a supplementary valve 16, and a controller 17 including a cup controller 17a and a valve controller 17b. The recovery cup 11a is an example of the first switching module, and the supplementary valve 16 is an example of the second switching module. The nozzle 11c is an example of the liquid supplier, and the temperature adjustment tank 12 is an example of a liquid tank.

FIG. 1 further illustrates channels L1 to L5 for an etching solution. The channels L1, L2 are examples of the first channel, and the channel L3 is an example of the second channel.

The treatment chamber 11 contains the wafer 1 and treats the wafer 1 by an etching solution. FIG. 1 illustrates X- and Y-directions perpendicular to each other and parallel to an installation surface of the treatment chamber 11, and a Z-direction perpendicular to the installation surface of the treatment chamber 11. In the present specification, the positive Z-direction is regarded as an upward direction, and the negative Z-direction is regarded as a downward direction. The negative Z-direction may or may not coincide with the gravitational direction.

The rotary shaft 11b supports and rotates the wafer 1. The wafer 1 includes a silicon substrate, which is an example of the substrate, and a silicon nitride film, which is an example of the film, provided on the substrate. The nozzle 11c supplies the etching solution from the channel L1 to this silicon nitride film. As a result, the silicon nitride film is etched by the etching solution, and silica dissolves from the silicon nitride film in the etching solution. The etching solution of the present embodiment is a phosphoric acid aqueous solution, for example.

The recovery cup 11a is movable in the upward and downward directions relative to the wafer 1. When the recovery cup 11a is at a high position, the etching solution supplied to the silicon nitride film is discharged into the channel L2 through a channel inside the recovery cup 11a, as indicated by the arrow P1. On the other hand, when the recovery cup 11a is at a low position, the etching solution supplied to the silicon nitride film is discharged into the channel L3 through a channel inside the recovery cup 11a, as indicated by the arrow P2. In this way, the recovery cup 11a can switch a discharge destination of the etching solution supplied to the silicon nitride film between the channel L2 and the channel L3.

The channel L1 and the channel L2 form a circulation channel for circulation of the etching solution between the treatment chamber 11 and the temperature adjustment tank 12. The temperature adjustment tank 12 and the first pump 13 are provided in this circulation channel. The temperature adjustment tank 12 reserves the etching solution, and the first pump 13 feeds the etching solution from the temperature adjustment tank 12 to the nozzle 11c.

The channel L2 recovers the etching solution discharged from the treatment chamber 11 (the arrow P1) into the temperature adjustment tank 12. As a result, the etching solution is fed to the nozzle 11c again through the channel L1. On the other hand, the channel L3 drains the etching solution discharged from the treatment chamber 11 (the arrow P2) out of the semiconductor manufacturing apparatus. Accordingly, the recovery cup 11a can switch between recovering and draining the etching solution.

The channel L4 forms a circulation channel for circulation of the etching solution between the temperature adjustment tank 12 and the heater 15. The heater 15 and the second pump 14 are provided in this circulation channel. The heater 15 heats the etching solution discharged from the temperature adjustment tank 12 into the channel L4. The etching solution heated by the heater 15 is returned to the temperature adjustment tank 12 by the second pump 14 through the channel L4. This adjusts a temperature of the etching solution flowing in the channel L1 and the channel L2 to a predetermined temperature.

The channel L5 is used for supplementing the temperature adjustment tank 12 with the etching solution (new etching solution). The supplementary valve 16 is provided in the channel L5 and used for switching between supplementing and not supplementing the temperature adjustment tank 12 with the new etching solution. The amount of etching solution circulating in the channels L1, L2 of the present embodiment can be reduced by drainage to the channel L3 and increased by supplementation from the channel L5.

The controller 17 controls operations of the semiconductor manufacturing apparatus. Examples of the controller 17 include a processor, an electric circuit and a personal computer (PC). For example, the controller 17 causes the cup controller 17a to control lift-up operation and lift-down operation of the recovery cup 11a, whereby the recovering amount and the draining mount of the etching solution is adjusted. Further, the controller 17 causes the valve controller 17b to control opening and closing and degree of opening of the supplementary valve 16, whereby the supplementing amount of the etching solution is adjusted.

The controller 17 of the present embodiment controls operations of the recovery cup 11a and the supplementary valve 16 to adjust concentration of silica in the etching solution to be supplied to the silicon nitride film. This adjustment of the silica concentration will be described in detail below.

Figure 2:
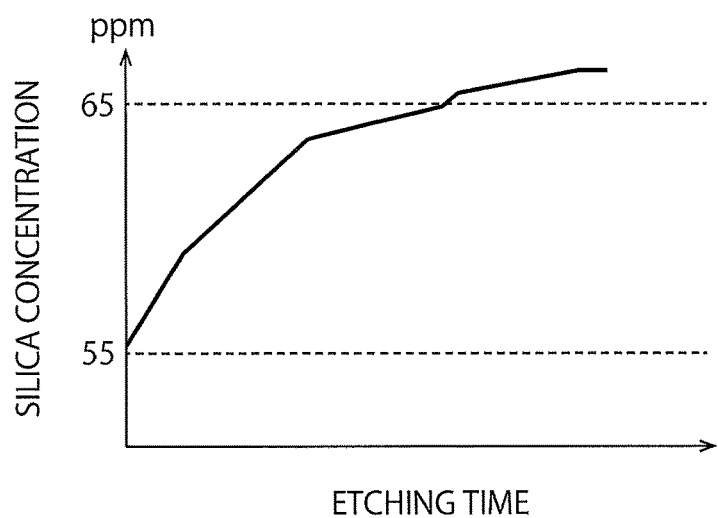
FIG. 2 is a graph for explaining operations of the semiconductor manufacturing apparatus of the first embodiment.

FIG. 2 is a graph for explaining operations of the semiconductor manufacturing apparatus of the first embodiment.

FIG. 2 shows changes in the silica concentration from the start of etching of the aforementioned silicon nitride film if the recovery of the etching solution is continued without draining or supplementing the etching solution. The vertical axis of FIG. 2 represents the silica concentration in the etching solution. The horizontal axis of FIG. 2 represents etching time during which the silicon nitride film has been treated with the etching solution. The etching time indicates a lapse of time from the start of etching.

As the etching time elapses from the start of etching of the silicon nitride film, the silica concentration increases from an initial concentration (here, 55 ppm). The silica concentration then exceeds a precipitating concentration (here, 65 ppm), at which silica in the etching solution starts to be precipitated. This causes silica in the etching solution to be precipitated. Accordingly, precipitation of silica needs to be prevented, but it is undesirable to frequently replace the etching solution to prevent precipitation of silica.

Figure 3A:
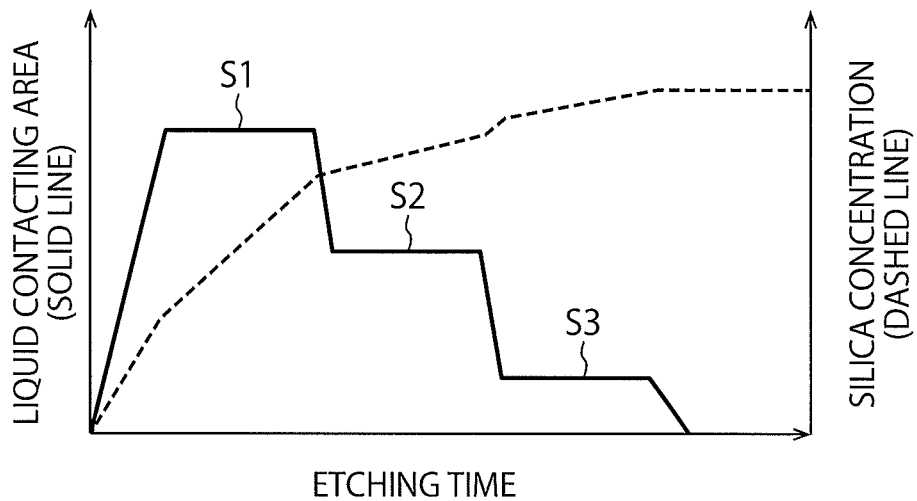
FIGS. 3A and 3B are other graphs for explaining the operations of the semiconductor manufacturing apparatus of the first embodiment.
Figure 3B:
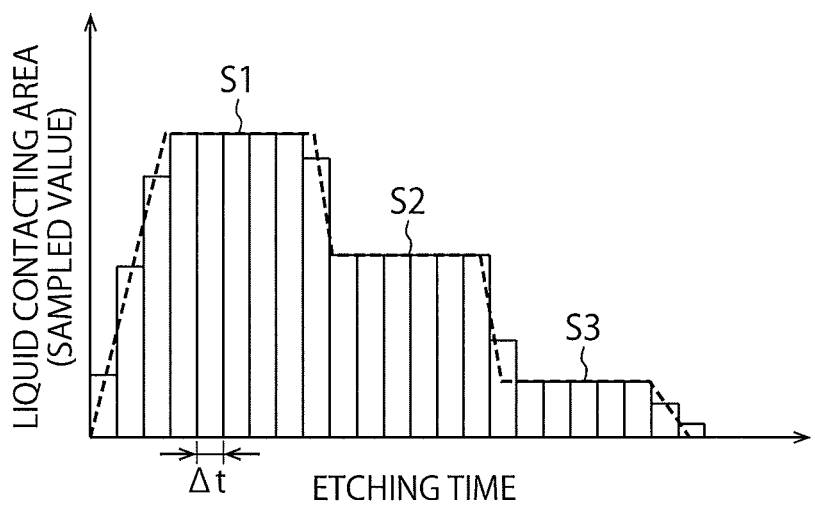

FIGS. 3A and 3B are other graphs for explaining the operations of the semiconductor manufacturing apparatus of the first embodiment.

FIG. 3A shows changes in a liquid contacting area and the silica concentration from the start of etching of the aforementioned silicon nitride film if the recovery of the etching solution is continued without draining or supplementing the etching solution as in FIG. 2. The liquid contacting area refers to an area where the silicon nitride film contacts the etching solution at each time point.

FIG. 3A exemplarily shows the case where the liquid contacting area decreases from S1 to S2 and from S2 to S3 with the lapse of the etching time. When the liquid contacting area is S1, the etching amount of the silicon nitride film is large, which results in the silica concentration sharply rising. On the other hand, when the liquid contacting area is S3, the etching amount of the silicon nitride film is small, which results in the silica concentration slowly rising.

FIG. 3B shows sampled values of the liquid contacting area shown in FIG. 3A. Specifically, FIG. 3B is a bar graph plotting sampled values that are obtained by sampling values of the liquid contacting area for each predetermined time "At". The controller 17 of the present embodiment controls operations of the recovery cup 11a and the supplementary valve 16 based on these sampled values.

FIGS. 4A to 4D are other graphs for explaining the operations of the semiconductor manufacturing apparatus of the first embodiment.

FIG. 4A exemplarily shows three sampled values K1 to K3. The sampled value K1 represents a small liquid contacting area, the sampled value K2 represents a medium liquid contacting area, and the sampled value K3 represents a large liquid contacting area. FIG. 4B, FIG. 4C and FIG. 4D respectively show operations of the nozzle 11c, the recovery cup 11a and the supplementary valve 16 at each of the three sampled values K1 to K3.

As shown in FIG. 4B, the nozzle 11c is always open, continuing to discharge the etching solution to the silicon nitride film. On the other hand, the recovery cup 11a and the supplementary valve 16 alternately and repeatedly recovers the etching solution and drains and supplements the etching solution, as shown in FIGS. 4C and 4D. Reference numerals A1 to A3 each denote a period in which the etching solution is recovered, and reference numerals B1 to B3 each denote a period in which the etching solution is drained and supplemented. In the former period, the supplementary valve 16 is closed to stop supplementing the temperature adjustment tank 12 with the etching solution. On the other hand, in the latter period, the supplementary valve 16 is opened to supplement the temperature adjustment tank 12 with the etching solution.

In the former period, the etching solution is entirely recovered with no etching solution being drained or supplemented. Accordingly, in the former period, the amount of etching solution circulating in the channels L1, L2 is constant. On the other hand, in the latter period, the etching solution is not recovered at all, but the etching solution is drained and supplemented. At this time, in the present embodiment, the draining amount of the etching solution is made equal to the supplementing amount of the etching solution. Accordingly, in the latter period too, the amount of etching solution circulating in the channels L1, L2 is constant.

However, in the present embodiment, a length ratio of the former period to the latter period is varied according to the sampled values. When the sampled value is K1, the ratio is set to A1:B1. When the sampled value is K2, the ratio is set to A2:62. When the sampled value is K3, the ratio is set to A3:B3. These satisfy relationships of A1>A2>A3, B1<B2<B3, and A1+B1=A2+B2=A3+B3="Δt".

For example, when the sampled value is K3, the liquid contacting area is large and a large amount of silica dissolves from the silicon nitride film. Accordingly, the period B3 is set longer to increase the draining amount and the supplementing amount of the etching solution. This allows to prevent an increase in the silica concentration despite a large amount of silica dissolving from the silicon nitride film.

On the other hand, when the sampled value is K1, the liquid contacting area is small and only a small amount of silica dissolves from the silicon nitride film. Accordingly, the period B1 is set shorter to reduce the draining amount and the supplementing amount of the etching solution. This allows to prevent an increase in the silica concentration while economizing the etching solution.

In this way, the controller 17 of the present embodiment controls operations of the recovery cup 11a and the supplementary valve 16 to adjust the recovering amount, the draining amount and the supplementing amount of the etching solution per unit time and to adjust the silica concentration. This allows for an efficient use of the etching solution according to the liquid contacting area.

For example, assume that the ratio of A1:B1 is set to 2:1 when the sampled value is K1 and the ratio of A3:B3 is set to 1:2 when the sampled value is K3. In this case, when the sampled value is K3, the supplementing period of the etching solution is twice than when the sampled value is K1. As a result, when the sampled value is K3, the supplementing amount of the etching solution per unit time (an average supplementing amount) is twice than when the sampled value is K1. This allows to supplement a larger amount of etching solution when the liquid contacting area is large than when the liquid contacting area is small. In this way, the controller 17 of the present embodiment controls operations of the recovery cup 11a and the supplementary valve 16 such that the recovering amount, the draining amount and the supplementing amount of the etching solution per unit time is varied according to the liquid contacting area.

The above explanation is based on an assumption that a flow rate of the etching solution discharged into the channel L2 for recovery of the etching solution, a flow rate of the etching solution discharged into the channel L3 for drainage of the etching solution and a flow rate of the etching solution flowing in the channel L5 for supplementing of the etching solution are each constant. Therefore, explanation has been given that doubling the supplementing period of the etching solution leads to doubling the average supplementing amount of the etching solution. However, in the present embodiment, these flow rates are not necessarily constant.

FIG. 5 is another graph for explaining the operations of the semiconductor manufacturing apparatus of the first embodiment.

The controller 17 of the present embodiment controls the recovery cup 11a and the supplementary valve 16 such that an increase in the silica concentration is prevented. Specifically, the controller 17 controls the recovery cup 11a and the supplementary valve 16 such that the silica concentration is maintained at a predetermined concentration (here, the initial concentration), as shown in FIG. 5. Since the control may involve errors, the control in the present embodiment is performed such that the silica concentration is maintained within a range of ±5 ppm from the predetermined concentration, namely within a range from 50 ppm to 60 ppm.

To perform this control, the controller 17 obtains information representing a relationship between the etching time and the liquid contacting area as a recipe before starting the etching. This information may be read from a storage device inside the semiconductor manufacturing apparatus, or may be received from outside of the semiconductor manufacturing apparatus through communication processing.

After starting the etching, the controller 17 adjusts the recovering amount, the draining amount and the supplementing amount of the etching solution at given etching time based on the liquid contacting area at that given etching time. The liquid contacting area at that given etching time can be identified from the above information representing the relationship between the etching time and the liquid contacting area. This adjustment is made for each time "Δt" using the sampled values of the liquid contacting area.

For example, when the sampled value of the liquid contacting area at etching time "t" is K1, the recovering period of the etching solution is set to A1 and the draining and supplementing periods of the etching solution are set to B1, during etching time from "t" to "t"+"Δt". Likewise, when the sampled value is K2, the recovering period is set to A2, and the draining and supplementing periods are set to B2. Likewise, when the sampled value is K3, the recovering period is set to A3, and the draining and supplementing periods are set to B3.

These periods are set to values that can keep the silica concentration at the predetermined concentration. Therefore, according to the present embodiment, controlling the recovery cup 11a and the supplementary valve 16 based on the etching time allows to maintain the silica concentration at the predetermined concentration.

The semiconductor manufacturing apparatus of the present embodiment may include a measuring instrument to measure the liquid contacting area of the silicon nitride film. In this case, the controller 17 may set the recovering period, the draining period and the supplementing period at each time point based on the measured liquid contacting area. This allows to maintain the silica concentration at the predetermined concentration, similarly to the above case of using the recipe.

The controller 17 of the present embodiment adjusts the silica concentration within the lower limit (50 ppm) and the upper limit (60 ppm) to maintain the silica concentration at the predetermined concentration (55 ppm). However, the upper and lower limits are not limited to these values. The upper limit of 60 ppm is set to take a margin of 5 ppm from the precipitating concentration (65 ppm). Meanwhile, the lower limit of 50 ppm is set to prevent an excessive etching of the silicon nitride film due to too much reduction in the silica concentration.

FIGS. 6A to 7B are cross-sectional views illustrating a method of manufacturing a semiconductor device of the first embodiment. The semiconductor device is a three-dimensional semiconductor memory.

Figure 6A:
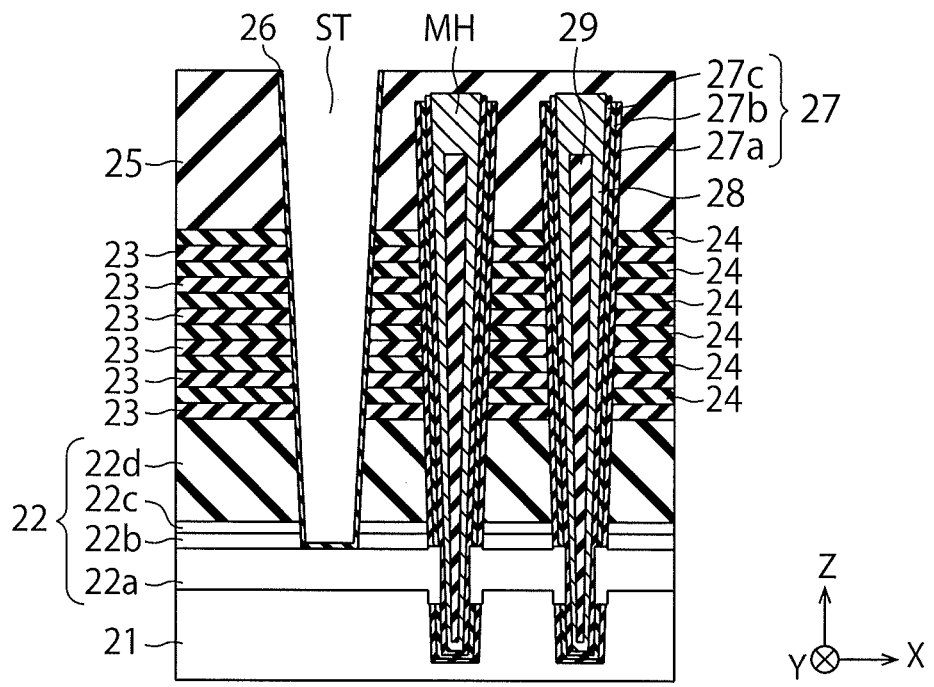
FIGS. 6A to 7B are cross-sectional views illustrating a method of manufacturing a semiconductor device of the first embodiment.

FIG. 6A illustrates a substrate 21, a base layer 22, plural first insulating layers 23, plural second insulating layers 24 and an inter layer dielectric 25. The substrate 21 is, for example, a semiconductor substrate such as a silicon substrate. The base layer 22 includes a first base layer 22a, a second base layer 22b, a third base layer 22c and an inter layer dielectric 22d sequentially formed on the substrate 21. The inter layer dielectric 22d is, for example, a silicon oxide film.

The plural first insulating layers 23 and the plural second insulating layers 24 are alternately formed on the inter layer dielectric 22d. The first insulating layer 23 is, for example, a silicon oxide film. The second insulating layer 24 is, for example, a silicon nitride film. The inter layer dielectric 25 is formed on these first and second insulating layers 23, 24. The inter layer dielectric 25 is, for example, a silicon oxide film.

FIG. 6A illustrates the state where a shallow trench ST penetrating the first and second insulating layers 23, 24 and the like is formed and a cover insulator 26 is formed on the sides and bottom of the shallow trench ST. The cover insulator 26 is, for example, a silicon nitride film.

FIG. 6A further illustrates a memory insulator 27, a channel semiconductor layer 28 and a core insulator 29 sequentially formed in each memory hole MH penetrating the first and second insulating layers 23, 24 and the like. The memory insulator 27 includes a block insulator 27a such as a silicon oxide film, a charge storage layer 27b such as a silicon nitride film, and a tunnel insulator 27c such as a silicon oxide film. The channel semiconductor layer 28 is, for example, a polysilicon layer, and the core insulator 29 is, for example, a silicon oxide film.

In FIG. 6A, the plural second insulating layers 24 and the cover insulator 26 are the silicon nitride films to be treated by the etching solution. Treatment of these silicon nitride films is performed by the semiconductor manufacturing apparatus of FIG. 1. Details of this treatment will be explained with reference to FIGS. 6B to 7B.

Figure 6B:
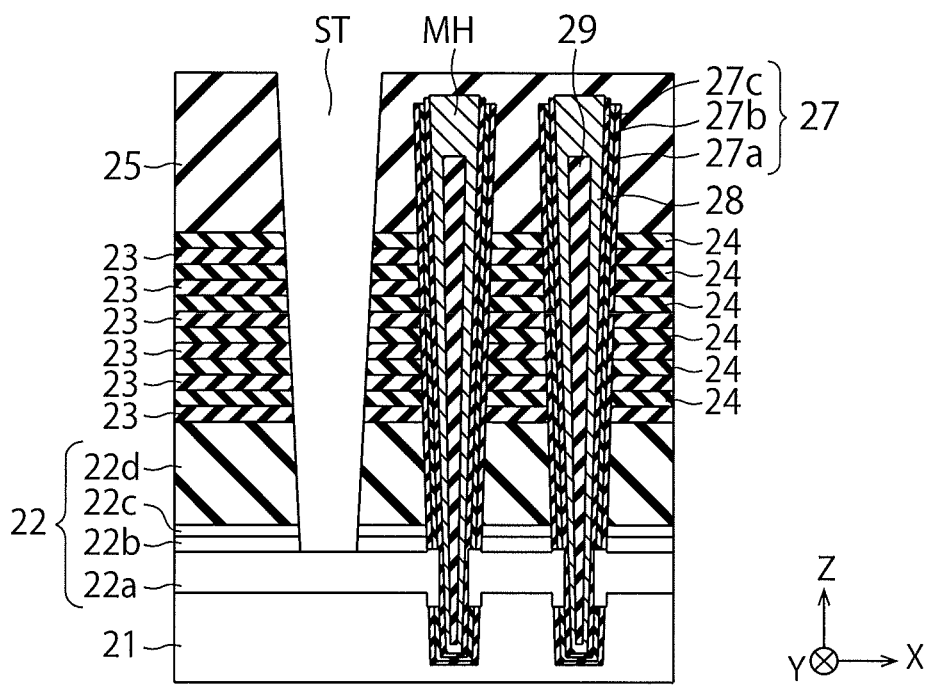

First, the cover insulator 26 is removed by the etching solution (FIG. 6B). At this time, the liquid contacting area is S1 shown in FIG. 3B. The liquid contacting area S1 equals areas of the sides and bottom of the shallow trench ST, occupying a large area.

Figure 7A:
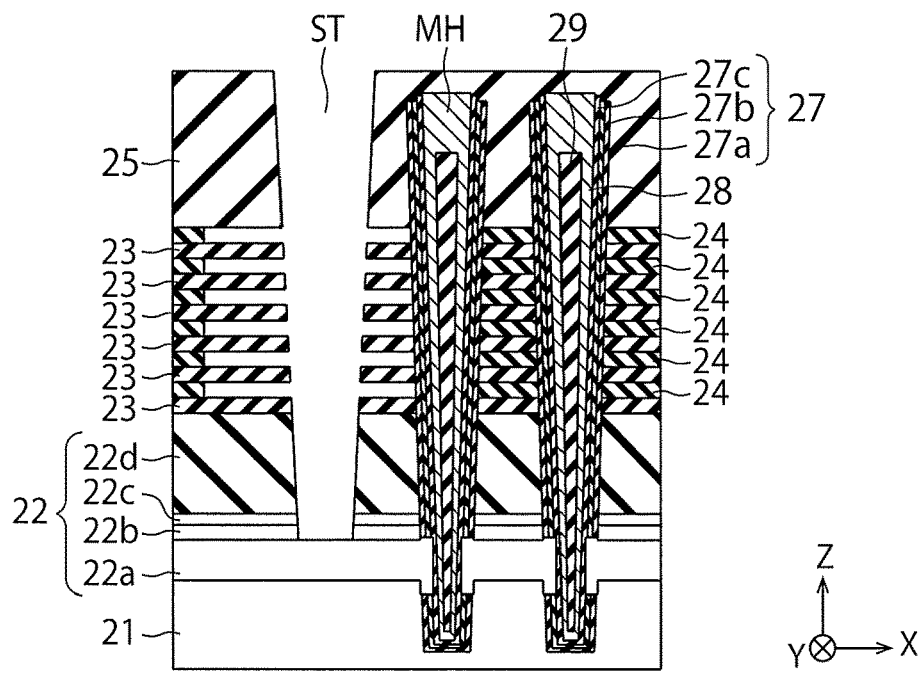

Next, the plural second insulating layers 24 start to be removed by the etching solution (FIG. 7A). At this time, the liquid contacting area is S2 shown in FIG. 3B. The liquid contacting area S2 equals areas of the sides of these second insulating layers 24, becoming smaller than the liquid contacting area S1.

Figure 7B:
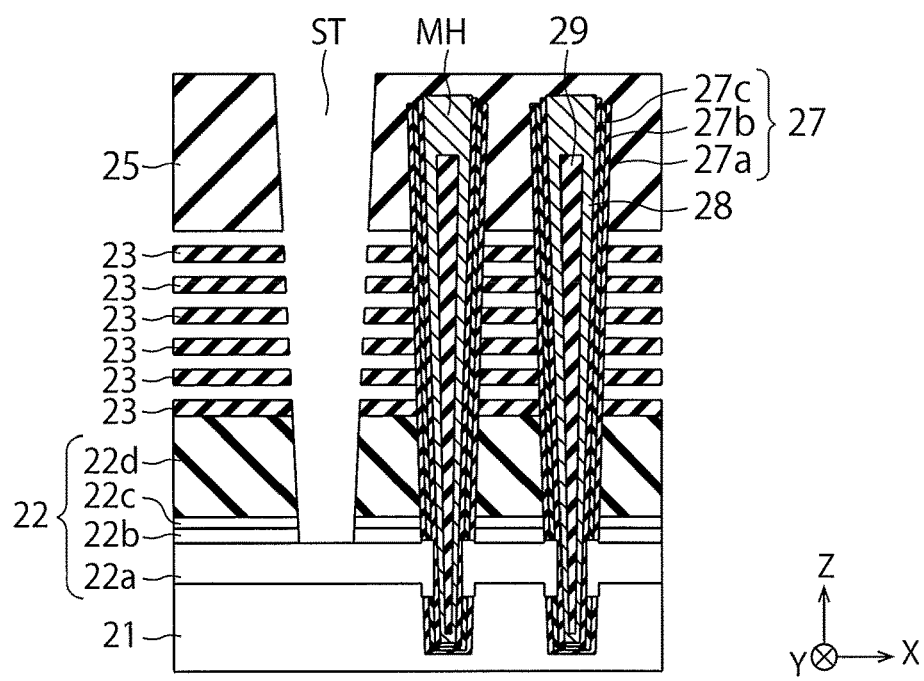

Then, the second insulating layers 24 continue to be removed by the etching solution after the etching solution reaches the memory insulators 27 (FIG. 7B). At this time, the liquid contacting area is S3 shown in FIG. 3B. The liquid contacting area S3 equals that obtained by subtracting areas of the sides of the memory insulators 27 from the areas of the sides of the second insulating layers 24, becoming smaller than the liquid contacting area S2.

In this way, the liquid contacting area decreases as the etching proceeds. Accordingly, with the decrease in the liquid contacting area, the controller 17 shortens the draining and supplementing periods of the etching solution. This allows for an efficient use of the etching solution according to the liquid contacting area.

Thereafter, an electrode layer such as a tungsten layer is formed within each cavity produced by removing the second insulating layers 24. This results in an alternately stacked structure of the plural first insulating layers 23 and the plural electrode layers. In this way, the semiconductor device of the present embodiment is manufactured.

As described above, the controller 17 of the present embodiment controls the recovery cup 11a and the supplementary valve 16 to adjust the silica concentration in the etching solution to be supplied to the silicon nitride film on the substrate. Therefore, the present embodiment allows for an efficient use of the etching solution such as by preventing precipitation of silica and wasteful use of the etching solution.

The semiconductor manufacturing apparatus of the present embodiment is a single wafer apparatus; however, the semiconductor manufacturing apparatus may be a batch type apparatus. Further, the recovery cup 11a of the present embodiment may be replaced with any other component that switches between recovering and draining the etching solution (e.g. a valve). Likewise, the supplementary valve 16 of the present embodiment may be replaced with any other component that switches between supplementing and not supplementing the etching solution. Although the present embodiment has described K1 to K3 as examples of the sampled values of the liquid contacting area, the number of kinds of the sampled values are not limited to three.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
   a liquid supplier configured to supply liquid to a film on a substrate and cause a substance to dissolve from the film in the liquid;
   a first channel configured to recover the liquid supplied to the film and feed the liquid again to the liquid supplier;
   a liquid tank provided in the first channel and configured to retain the liquid;
   a heater configured to heat the liquid discharged from the liquid tank and return the heated liquid to the liquid tank;
   a second channel configured to drain the liquid supplied to the film;
   a first switching module configured to switch a discharge destination of the liquid supplied to the film between the first channel and the second channel;
   a second switching module configured to switch between supplementing and not supplementing the liquid tank in the first channel with new liquid; and
   a controller configured to control the first and second switching modules to adjust concentration of the substance in the liquid to be supplied to the film such that the concentration of the substance in the liquid to be supplied to the film is maintained at a predetermined concentration,
   wherein
   the controller stops supplementing the first channel with the new liquid when discharging the liquid into the first channel, and supplements the first channel with the new liquid when discharging the liquid into the second channel,
   the controller controls the first and second switching modules to adjust a recovering amount per unit time by which the liquid is recovered through the first channel, a draining amount per unit time by which the liquid is drained through the second channel, and a supplementing amount per unit tithe by which the new liquid is supplemented into the first channel,
   the controller controls the first and second switching modules based on a treatment time during which the film has been treated with the liquid such that the recovering amount, the draining amount, and the supplementing amount vary according to a liquid contacting area where the film contacts the liquid the controller adjusting the receiving amount, the draining amount, and the supplementing amount at a given treatment time based on the liquid contacting area at the given treatment time, and the controller obtains information representing a relationship between the treatment time and the liquid contacting area by reading the information from a storage device or receiving the information through communication processing, and controls the first and second switching modules based on the obtained information and the treatment time such that the recovering amount, the draining amount, and the supplementing amount vary according to the liquid contacting area.

2. The apparatus of claim 1, wherein the film and the substance each comprises a silicon element.

3. The apparatus of claim 1, wherein the liquid is an etching solution to etch the film.

4. A method of manufacturing a semiconductor device, comprising:

supplying liquid from a liquid supplier to a film on a substrate and causing a substance to dissolve from the film in the liquid;

recovering the liquid supplied to the film through a first channel and feeding the liquid again to the liquid supplier;

retaining the liquid in a liquid tank that is provided in the first channel;

heating, by the heater, the liquid discharged from the liquid tank;

draining the liquid supplied to the film through a second channel;

switching, by a first switching module, a discharge destination of the liquid supplied to the film between the first channel and the second channel;

switching, by a second switching module, between supplementing and not supplementing the liquid tank in the first channel with new liquid; and controlling the first and second switching modules by a controller to adjust concentration of the substance in the liquid to be supplied to the film such that the concentration of the substance in the liquid to be supplied to the film is maintained at a predetermined concentration, wherein the controller stops supplementing the first channel with the new liquid when discharging the liquid into the first channel, and supplements the first channel with the new liquid when discharging the liquid into the second channel, the controller controls the first and second switching modules to adjust a recovering amount per unit time by which the liquid is recovered through the first channel, a draining amount per unit time by which the liquid is drained through the second channel, and a supplementing amount per unit time by which the new liquid is supplemented into the first channel, the controller controls the first and second switching modules based on a treatment time during which the film has been treated with the liquid such that the recovering amount, the draining amount, and the supplementing amount vary according to a liquid contacting area where the film contacts the liquid, the controller adjusting the receiving amount, the draining amount, and the supplementing amount at a given treatment based on the liquid contacting area at the given treatment time, the controller obtains information representing a relationship between the treatment time and the liquid contacting area by reading the information from a storage device or receiving the information through communication processing, and controls the first and second switching modules based on the obtained information and the treatment time such that the recovering amount, the draining amount, and the supplementing amount vary according to the liquid contacting area, and the film includes a plurality of second insulating layers that are alternately formed with a plurality of first insulating layers on the substrate, and an insulator formed on side faces of the first insulating layers and the second insulating layers.

5. The method of claim 4, wherein the film and the substance each comprises a silicon element.

6. The method of claim 4, wherein the liquid is an etching solution to etch the film.

* * * * *